US008623673B1

(12) United States Patent
Dyer et al.

(10) Patent No.: US 8,623,673 B1
(45) Date of Patent: Jan. 7, 2014

(54) STRUCTURE AND METHOD FOR DETECTING DEFECTS IN BEOL PROCESSING

(75) Inventors: Thomas W. Dyer, Pleasant Valley, NY (US); Tze-Man Ko, Hopewell Junction, NY (US); Yiheng Xu, Hopewell Junction, NY (US); Shaoning Yao, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/572,720

(22) Filed: Aug. 13, 2012

(51) Int. Cl.
*H01L 21/66* (2006.01)
*H01L 21/306* (2006.01)

(52) U.S. Cl.
USPC ........ 438/18; 438/692; 257/48; 257/E21.524; 257/E21.53; 257/E21.531

(58) Field of Classification Search
None
See application file for complete search history.

(56) References Cited

U.S. PATENT DOCUMENTS

| | | | |
|---|---|---|---|
| 6,787,800 B2 | 9/2004 | Weiland et al. | |
| 7,024,642 B2 | 4/2006 | Hess et al. | |
| 7,154,115 B2 | 12/2006 | Stine et al. | |
| 7,253,436 B2 | 8/2007 | Matsumoto et al. | |
| 7,317,203 B2 | 1/2008 | Chen et al. | |
| 7,348,594 B2 | 3/2008 | Ciplickas et al. | |
| 7,420,229 B2 | 9/2008 | Schultz et al. | |
| 7,888,961 B1 | 2/2011 | Brozek | |
| 2001/0026364 A1* | 10/2001 | Ravid et al. | 356/237.2 |
| 2005/0074908 A1* | 4/2005 | Ciplickas et al. | 438/14 |
| 2007/0210306 A1 | 9/2007 | Molinelli Acocella et al. | |
| 2008/0246030 A1* | 10/2008 | Satya et al. | 257/48 |
| 2009/0061543 A1* | 3/2009 | Ukraintsev | 438/14 |
| 2010/0238603 A1* | 9/2010 | Chung | 361/301.4 |
| 2011/0086445 A1* | 4/2011 | Choi et al. | 438/17 |

OTHER PUBLICATIONS

Carpio, R., et. al., Material and Design Considerations for Zero Defect CMP Pads, downloaded from URL<http://semiquestinc.com/CMPUG_Full%20Paper_083107_FINAL.pdf> on Apr. 18, 2013.*
Karthikeyan et al. "Short-Flow Test Chip Utilizing Fast Testing for Defect Density Monitoring in 45nm", 2008 IEEE Conference on Microelectronic Test Structures, Mar. 24-27, Edinburgh, UK, pp. 56-61.

(Continued)

*Primary Examiner* — Thomas L Dickey
*Assistant Examiner* — Joseph Schoenholtz
(74) *Attorney, Agent, or Firm* — Kevin B. Anderson; Catherine Ivers

(57) ABSTRACT

A test structure and method for monitoring process uniformity. Embodiments of the invention include test structures having a first metallization layer, a second metallization layer formed above the first metallization layer, a defect-generating region in a first metallization layer, a defect-dispersing region in the second metallization layer above the defect-generating region; and a defect-detecting region in the second metallization layer adjacent to the defect-dispersing region. The defect-generating region of the exemplary embodiment may have zero pattern density, uniform non-zero pattern density, or non-uniform non-zero pattern density. The defect-detecting region may include a test pattern such as, a comb-serpentine structure. Embodiments may include more than one defect-generating region, more than one defect-dispersing region, or more than one defect-detecting region. Embodiments may further include methods of manufacturing said test structures and methods of utilizing said test structures to monitor back end processes and determine if such processes are within specification limits.

13 Claims, 10 Drawing Sheets

(56) References Cited

OTHER PUBLICATIONS

El-Karek et al. "Yield Management in Microelectronic Manufacturing", IBM Microelectronics, Semiconductor R&D Center, Hopewell Junction, NY., 1995 IEEE, pp. 58-63.

www.ip.com, "Chip Design for a Defect Detection Standard", IP.com No. IPCOM000122504D, Publication date: Dec. 1, 1991.
www.ip.com, "A structure and method to detect circuit opens with improved sensitivity", IP.com No. IPCOM000193412D. Publication date: Feb. 22, 2010.

* cited by examiner

STRUCTURE AND METHOD FOR DETECTING DEFECTS IN BEOL PROCESSING

BACKGROUND

The present invention generally relates to semiconductor devices, and specifically to a structure for detecting defects that may occur while forming back-end-of-the-line structures.

In the manufacture of semiconductor devices, process-induced physical defects in back-end manufacturing processes may cause electrical defects, such as shorts and opens that interfere with device performance and therefore decrease yield. One such process-induced defect is residual material which arises when excess material deposited in back-end structures is not completely removed by a planarization process such as chemical-mechanical planarization (CMP). For example, process-induced defects can occur due to a non-uniform pattern density which leads to a non-uniform polish.

As the dimensions of semiconductor devices have steadily decreased, it has become increasingly difficult to monitor the presence of defects on the devices directly. One approach for addressing these defects has been the fabrication of test structures during the relevant manufacturing process that may be easily examined, either electrically or optically, for defects. The test structures are manufactured at the same time and by the same manufacturing processes, so that by determining defect concentrations on the test structures, it may be possible to approximate the defect concentration of the actual semiconductor devices.

Typically, these test structures are located in the space between the chips (referred to as the kerf) and are not located in the chip area (i.e. not within the chip die) itself. However, defect concentration may not be uniform across a chip. Moreover, some test structures rely on their proximity to the defect source to be able to detect certain kinds of defects. Therefore, it may be advantageous to construct test structure consisting of a potential defect-generating region, a defect-dispersing region and a defect-sensing region that may be located throughout the chip area.

BRIEF SUMMARY

The present invention relates to a test structure that may be used to detect defects formed in back-end structures of semiconductor devices and methods of forming said test structures. According to at least one exemplary embodiment, a test structure may include a first metallization layer, a second metallization layer formed above the first metallization layer, a defect-generating region formed in a first metallization layer, a defect-dispersing region formed in the second metallization layer above the defect-generating region; and a defect-detecting region formed in the second metallization layer adjacent to the defect-dispersing region. The defect-generating region of the exemplary embodiment may have zero pattern density, uniform non-zero pattern density, or non-uniform non-zero pattern density.

Exemplary embodiments may further include methods of forming test structures including a defect-generating region, a defect-dispersing region and a defect-detecting region.

Exemplary embodiments may further include methods of using test structures including a defect-generating region, a defect-dispersing region and a defect-detecting region to determine the uniformity of back-end processes such as chemical-mechanical planarization.

DETAILED DESCRIPTION

Figure 1A:
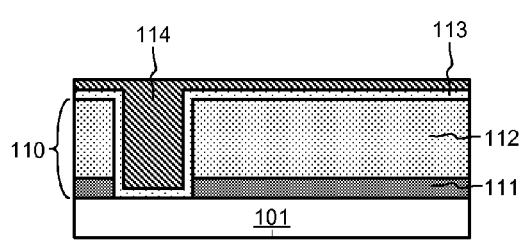
FIGS. 1A-1G depict various stages in a back-end-of-the-line-process while identifying one potential cause of defects in such a process.
Figure 1B:
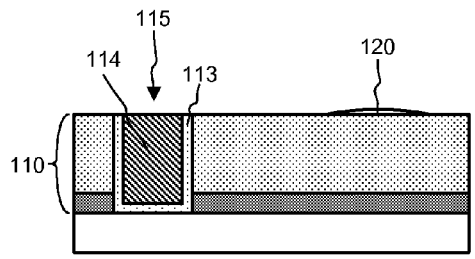

Referring to FIGS. 1A-1G, one mechanism of generating process-induced defects is described, where non-uniform planarization of a first metallization layer causes defects in a second metallization layer formed above the first metallization layer. Referring to FIG. 1A, first metallization layer 110 may be formed by depositing a first dielectric layer 111 and a second dielectric layer 112 on the surface of preceding structure 101 (for example, a preceding metallization layer or microelectronic device), etching first dielectric layer 111 and second dielectric layer 112 to form recess regions (not shown), and depositing a liner 113 and metal fill 114 in the recess regions to form back-end features (such backend features may include, for example, via or line 115, as depicted in FIG. 1B). The details of structure 101 have been omitted for illustrative simplicity.

Referring to FIG. 1B, the structure of FIG. 1A may then be planarized, for example by CMP, to remove the excess material of liner 113 and metal fill 114. However, the planarization process sometimes results in non-uniform polishing, where some excess material of liner 113 and/or metal fill 114, such as residue sheet 120, remains on the top surface of second dielectric layer 112. Due to the nature of the planarization polish, defects such as residue sheet 120 are more likely to occur in areas where first metallization layer 110 has a low pattern density. Pattern density of the first metallization layer 110 may be defined as the top-down area of back-end features such as via 115 in a given area of first metallization layer 110 divided by the overall top-down area of the given area. As will be seen in FIG. 1C-1G, the presence of residue sheet 120 may result in physical and/or electrical defects when a second metallization layer 130 is then formed on first metallization layer 110.

Figure 1C:
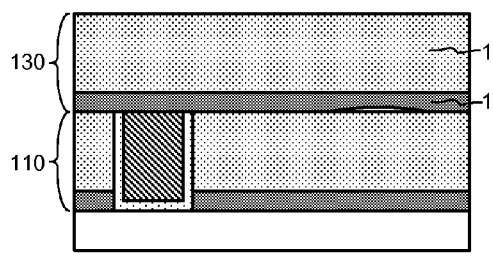
Figure 1D:
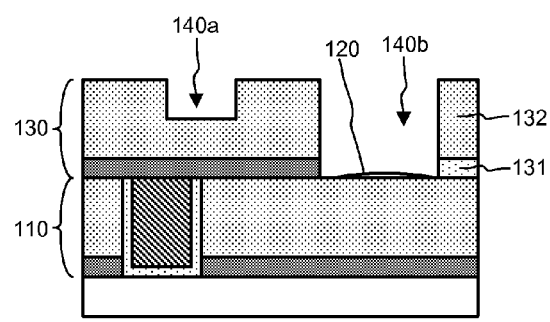
Figure 1E:
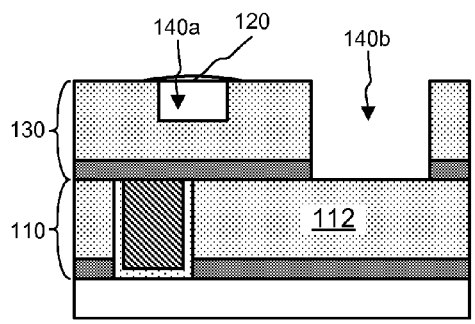
Figure 1F:
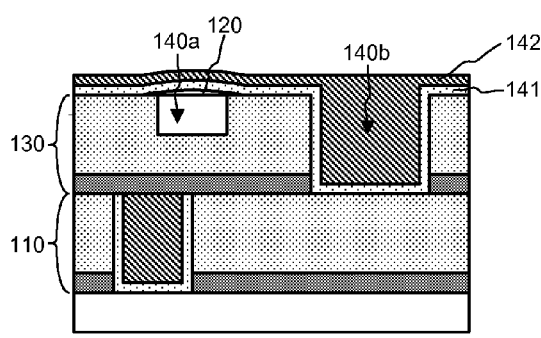
Figure 1G:
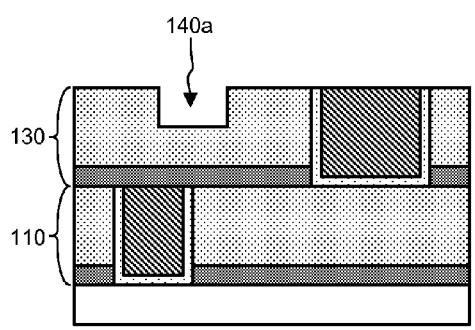

Referring to FIG. 1C, second metallization layer 130 may be formed by first depositing a third dielectric layer 131 and a fourth dielectric layer 132 on the surface of the structure of FIG. 1B. Referring to FIG. 1D, residue sheet 120 may be exposed when third dielectric layer 131 and a fourth dielectric layer 132 are etched to form recess regions 140a and 140b for back-end features of the second metallization layer 130. As depicted in FIG. 1E, residue sheet 120 can then be lifted from the surface of first metallization layer 110 and relocated across the surface of the structure by processes such as a wet clean. When residue sheet 120 is relocated to the area of recess region 140a, defects may occur that may reduce device performance and yield. For example, as shown in FIG. 1F, residue sheet 120 may block recess region 140a while liner 141 and metal fill 142 are deposited on the structure of FIG. 1E. As depicted in FIG. 1G, when excess material of liner 141 and/or metal fill 142 (FIG. 1F) is polished away, recess region 140a may remain empty or partially filled. This empty recess region would represent an open in the metal structure of second metallization layer 130. Residues such as residue sheet 120 may also cause defects through other mechanisms, such as causing shorts by bridging two unconnected back-end features of the same or different metallization layers. Accordingly, a test structure may be provided to detect process-induced physical defects such as residue metal, which may lead to electrical defects, such as shorts and opens. As used in this application, the term generic "defect" pertains to both electrical defects, such as shorts and opens, and/or to physical defects such as residual material. The physical defects may or may not lead to an electrical defect.

Exemplary embodiments of the present invention include a test structure including a first metallization layer and a second metallization layer capable of detecting the defects resulting from non-uniform planarization of the first metallization layer, as detailed in FIG. 1A-1G. Embodiments may include, as part of the first metallization layer, a defect-generating region, and, as part of the second metallization layer, a defect-dispersing region and a defect-detecting region. The defect-generating region is designed to accurately simulate the process conditions used to form actual back-end structures of the same metallization layer, such as those depicted in FIGS. 1A-1B. Defect-detecting region is a structure formed in the second metallization layer capable of detecting the defects formed by the defect-generating region in the first metallization layer. Defect-dispersing region is a structure formed in the second metallization capable of transporting the defects formed by the defect-generating region from the defect-generating region to the defect-detecting region. By incorporating a defect-dispersing region near the defect-detecting region as part of the test structure, the test structure is no longer required to be located near structures that independently generate physical defects, such as the kerf, in order to function reliably. Therefore, test structures according to embodiments of the present invention may be capable of being located wherever necessary to monitor relevant manufacturing processes throughout the chip area.

Figure 2A:
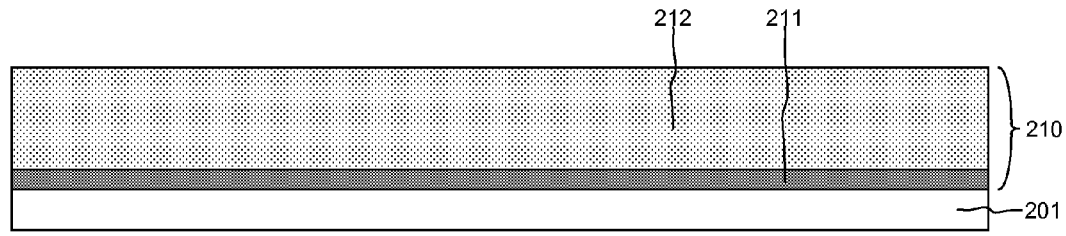
FIGS. 2A-2I depict steps of a method for constructing a structure for detecting defects, according to one embodiment of the invention.
Figure 2B:
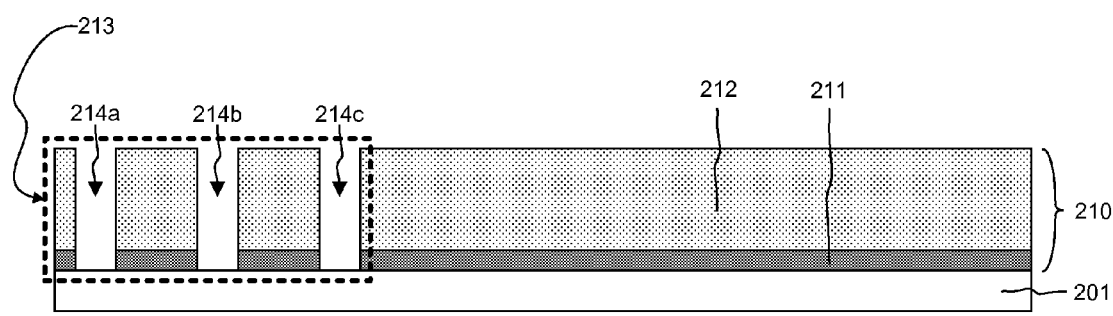
Figure 2C:
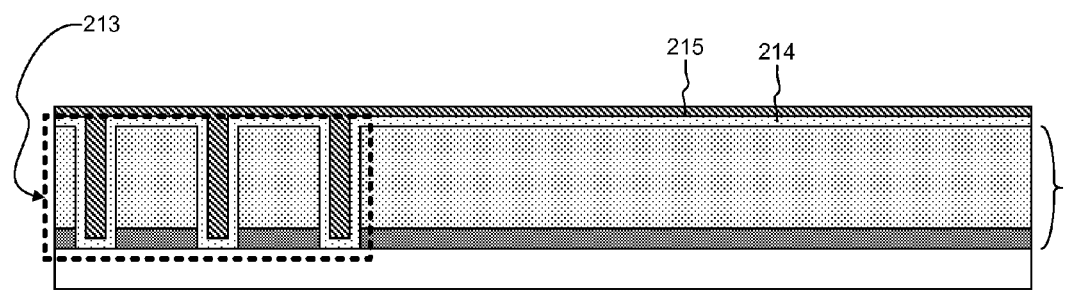
Figure 2D:
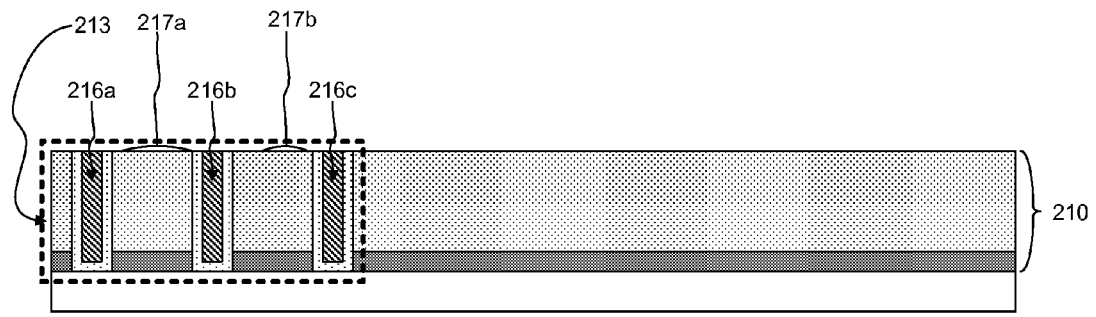
Figure 2E:
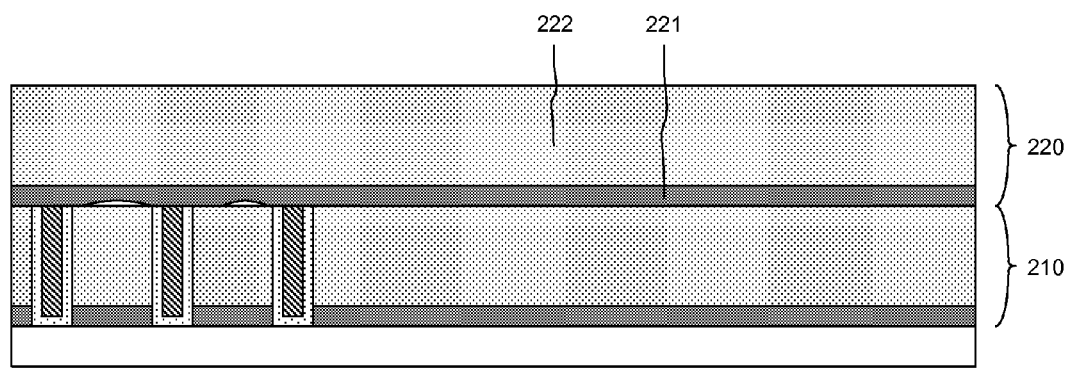
Figure 2F:
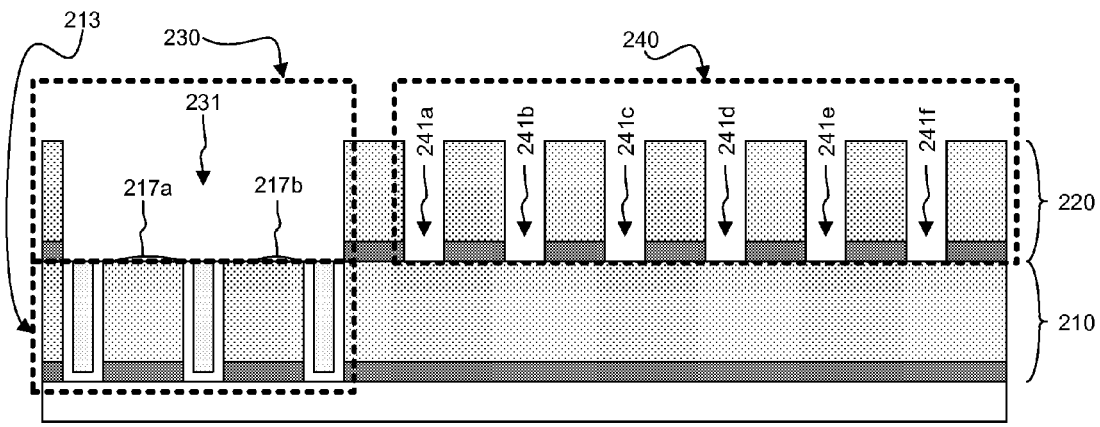

FIGS. 2A-2I depict a process of manufacturing an exemplary embodiment of the test structure of the present invention, including a defect-generating region 213 (FIG. 2B), a defect-dispersing region 230 (FIG. 2F), and a defect-detecting region 240 (FIG. 2F).

Referring to FIG. 2A, a first metallization layer 210, including a first dielectric layer 211 and a second dielectric layer 212, is formed above a preceding structure 201, such as a preceding metallization layer or microelectronic device. The details of preceding structure 201 have been omitted for illustrative simplicity.

FIGS. 2B-2E illustrate a process by which defect-generating region 213 may be formed as part of first metallization layer 210. Referring to FIG. 2B, defect-generating region 213 may be formed by etching first metallization layer 210 to form recess regions 214a-214c. The top-down area of recess regions 214a-214c divided by the top-down area of defect-generating region 213 defines the pattern density of defect-generating region 213.

Referring to FIG. 2C, recess regions 214a-214c (FIG. 2B) of defect-generating region 213 are filled with metal by depositing metal layers 214 and 215 on the top surface of the structure of FIG. 2B.

Referring to FIG. 2D, the structure of FIG. 2C is planarized, using, for example, CMP, to remove excess material from metal layers 214 (FIG. 2C) and 215 (FIG. 2C) to form metal features 216a-216c as part of defect-generating region 213. If the planarization is not uniform, residue sheets 217a and 217b may remain on the surface of first metallization layer 210.

FIGS. 2E-2I illustrate a process by which defect-dispersing region 230 and defect-detecting region 240 may be formed as part of a second metallization layer 220. Referring to FIG. 2E, second metallization layer 220, including a third dielectric layer 221 and a fourth dielectric layer 222, may be formed above first metallization layer 210.

Figure 3B:
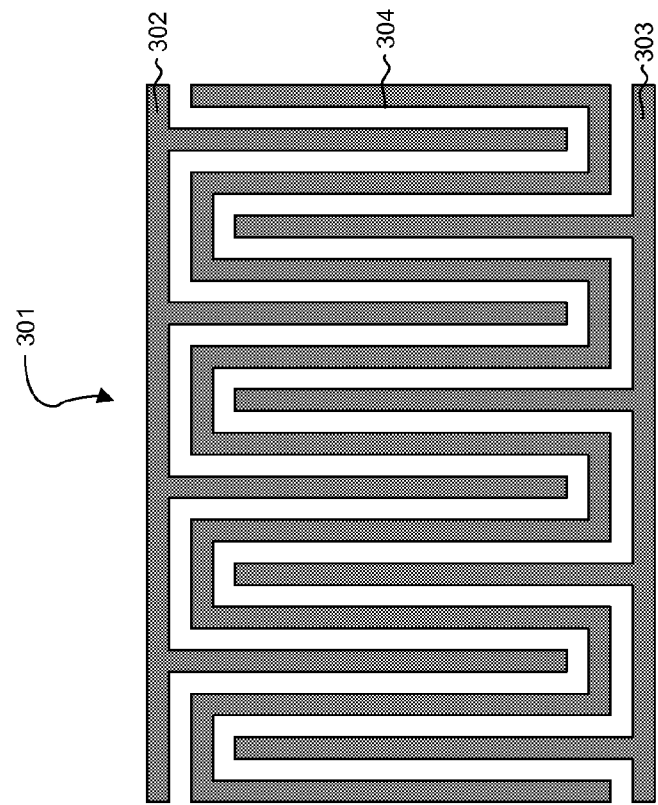
FIG. 3B depicts an exemplary test pattern that may be included in some embodiments.

Referring to FIG. 2F, second metallization layer 220 may be etched to form recess regions 231 and 241a-241f. Recess regions 241a-241f are formed as part of defect-detecting region 240 and, once filled with metal, may form the test pattern of defect-detecting region 240 (discussed later in more detail in conjunction with FIG. 3B). Recess region 231 may be formed as part of defect-dispersing region 230, above defect-generating region 213. While forming recess region 231 as part of defect-dispersing region 230, physical defects, such as residue sheets 217a and 217b, resulting from uneven polishing of first metallization layer 210 in FIG. 2D, may be exposed.

Figure 2G:
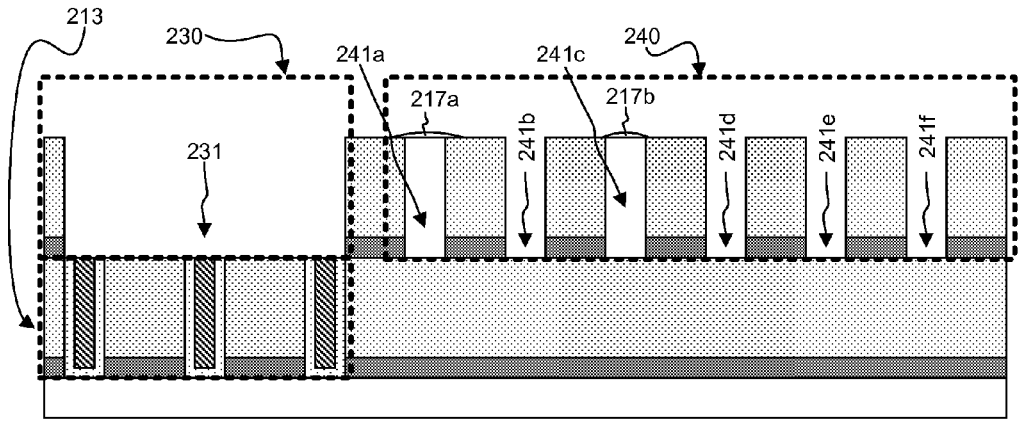

Referring to FIG. 2G, residue sheets 217a and 217b, now exposed during the formation of defect-dispersing region 230, may be dispersed across the surface of the structure by processes such as a wet clean, and land in a manner that blocks off some recess regions 241a-241f in defect-detecting region 240, such as recess regions 241a and 241c in the depicted embodiment.

Figure 2H:
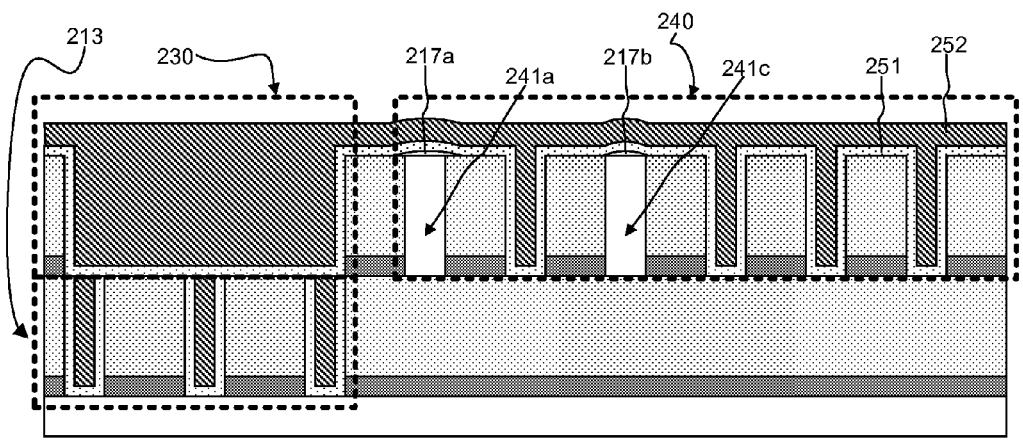

Referring to FIG. 2H, metal layers 251 and 252 are then deposited on the top surface of the structure of FIG. 2G to fill recess regions 231 and 241a-241f. Because recess regions 241a and 241c are blocked by residue sheets 217a and 217b, recess regions 241a and 241c remain empty.

Figure 2I:
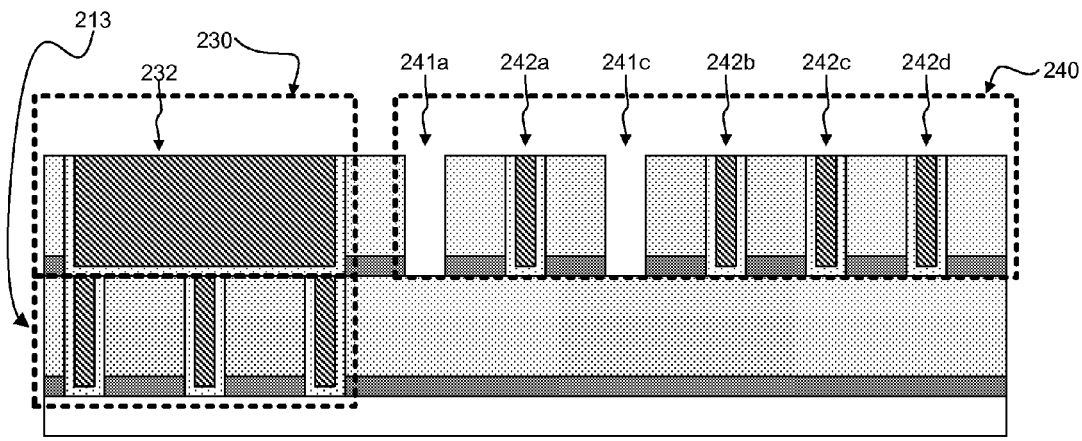

Referring to FIG. 2I, excess metal from layers 251 (FIG. 2H) and 252 (FIG. 2H) is removed, for example, by CMP, to form metal features 232 and 242a-242d. Subsequently, defect-detecting region 240 may be tested for defects. Because recess regions 241a and 241c remain empty, electrical tests will reveal resistances different than expected along paths passing through recess regions 241a and 241c, such that an unexpected resistance indicates the presence of one or more defects in defect-detecting region 240. Further, optical inspection may also reveal defects present in defect-detecting region 240 caused by residue sheets resulting from uneven polishing defect-generating region 213 of first metallization layer 210 and exposed by the formation of defect-dispersing region 230. Therefore, by determining the defect concentration of defect-detecting region 240, it is possible to determine information regarding the uniformity of the planarization process in defect-generating region 213.

By using the combination of a defect-generating region, a defect-dispersing region, and a defect-detecting region as discussed above in conjunction with FIGS. 2A-2I, a test structure according to one embodiment of the invention may be capable of being located throughout the chip area.

Figure 3A:
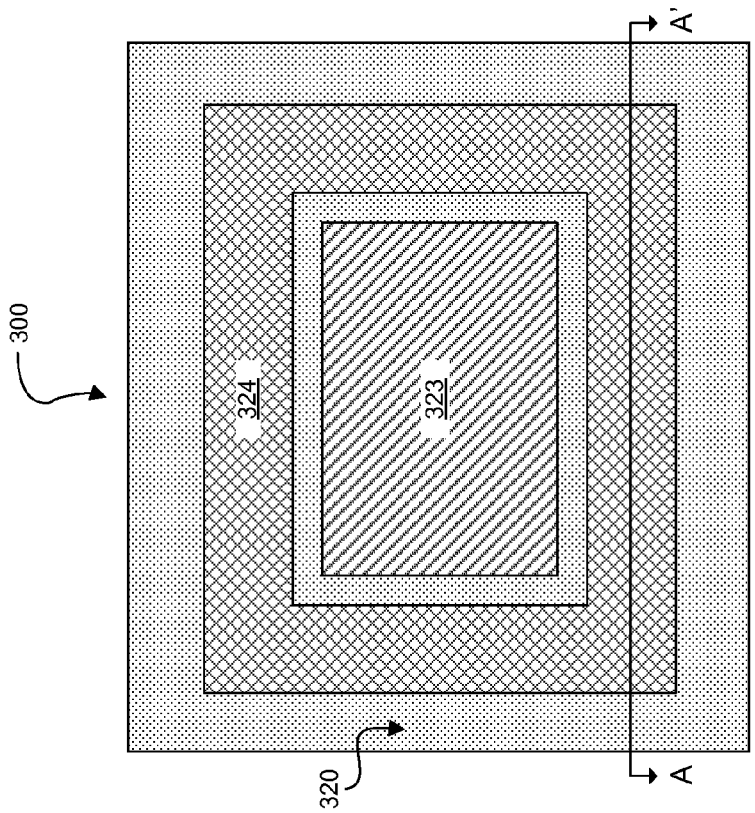
FIG. 3A depicts a top-down view of a structure for detecting defects according to one embodiment.
Figure 3C:
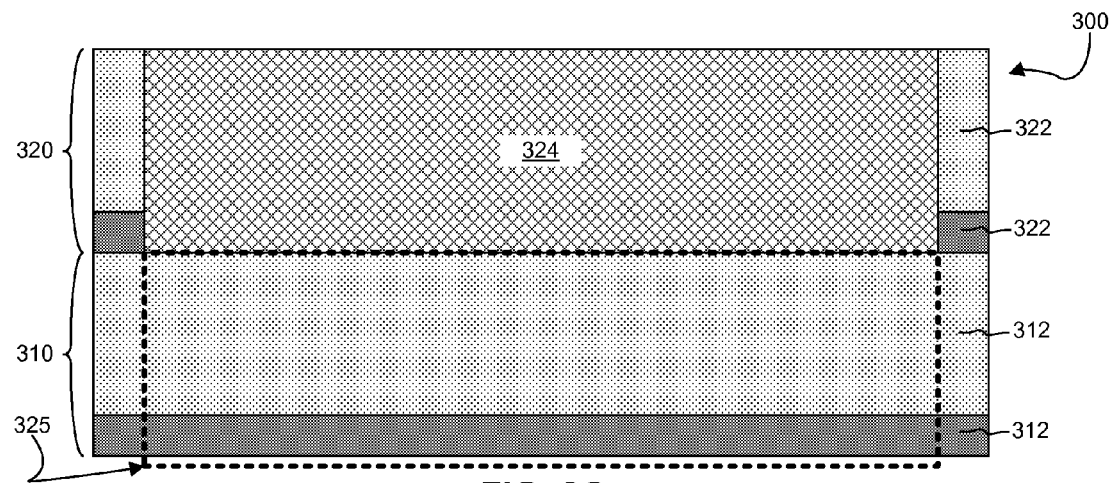
FIG. 3C-3E depict a cross-sectional views of the structure of FIG. 2A, according to three different embodiments having different pattern densities.
Figure 3D:
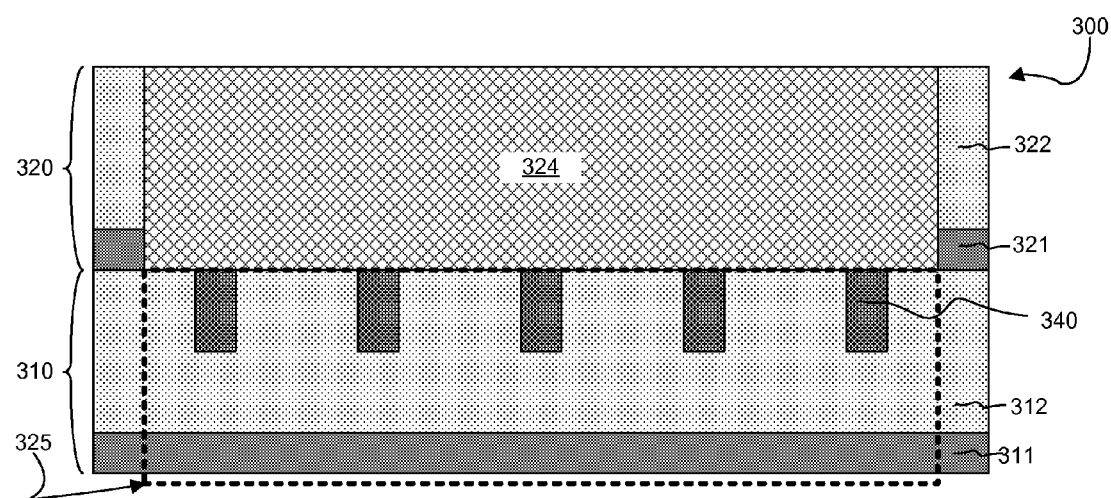
Figure 3E:
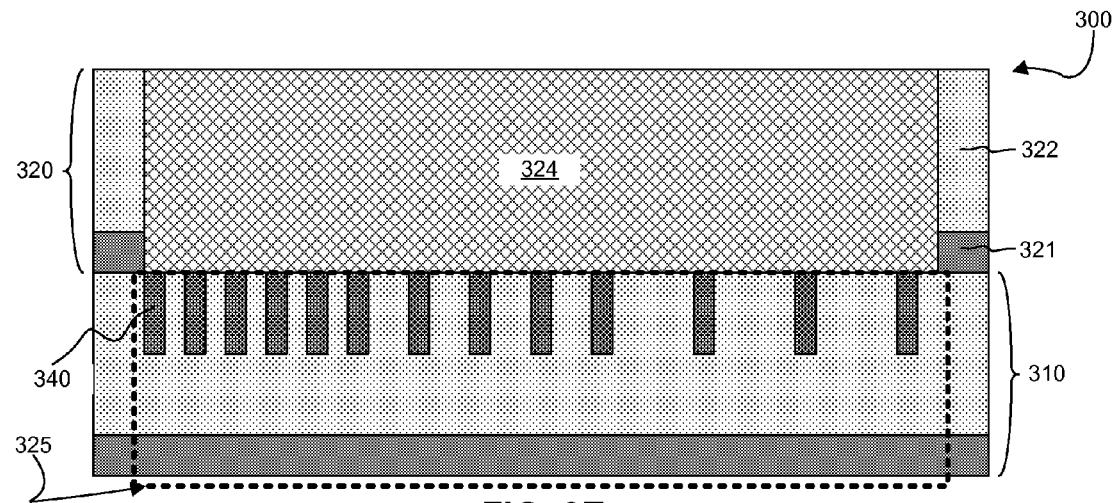

FIGS. 3A-3E illustrate in more detail how the defect-generating region, the defect-dispersing region, and the defect-detecting region may be configured. As depicted in FIGS. 3A-3E, test structure 300 includes a defect-detecting region 323 (FIG. 3A) and a defect-dispersing region 324 (FIG. 3A) in a second metallization layer 320 (FIG. 3A), and a defect-generating region 325 (FIGS. 3C-3E) in a first metallization layer 310 formed below second metallization layer 320 (FIGS. 3C-3E).

Referring to FIG. 3A, according to one embodiment, defect-dispersing region 324 may consist of a metal line (not shown in FIG. 3A) formed in second metallization layer 320 surrounding defect-detecting region 323. Preferably the metal line is wide, more preferably, about 1 micron. Defect-detecting region 323 may be adjacent to defect-dispersing region 324, meaning there are no other features present in second metallization layer 324 between defect-detecting region 323 and defect-dispersing region 324. Defect-detecting region 323 may or may not abut defect-dispersing region 324. Defect-detecting region 323 may include a test pattern such as the comb-serpentine structure 301 depicted in FIG. 2B, where two interlocking comb structures 302 and 303 are separated by a serpentine structure 304. The various lines of comb structures 302 and 303 and serpentine structure 304 may correspond to metal features 242a-242d of defect-detecting region 240 depicted in FIG. 2I (as well as recess regions 241a and 241c, where defects interfere with the formation of the test pattern. By forming electrical connections to various contacts (not shown) along comb structures 302 and 303 and serpentine structure 304, it is possible to determine the presence of defects by comparing the expected resistance between two contacts to the measured resistance. For example, a higher than expected resistance may indicate the presence of an open (such as recess regions 241a and 241c, depicted in FIG. 2I) along a continuous path. The presence of defects in defect-detecting region 323 may also be determined by other methods such as optically with a microscope, either manually or by an automated process. Other embodiments may include other test patterns, such as a via chain. Other embodiments of test structures with various defect-dispersing region 324 and defect-detecting region 323 configurations are described later in conjunction with FIGS. 6-9. The further description of test structure 300 in FIGS. 3C-3E may also apply to the alternate embodiments explained later in conjunction with FIGS. 6-9.

FIGS. 3C-3E are various cross sectional views of FIG. 3A along line A-A', which depict the defect-generating region 325 underneath defect-dispersing region 324. As illustrated, according to some embodiments, defect-generating region 325 may have, for example, a zero pattern density (FIG. 3C), a uniform non-zero pattern density (FIG. 3D), or a non-uniform non-zero pattern density (FIG. 3E). The various pattern densities associated with a particular defect-generating region may reflect the pattern density of a region of the circuit monitored by the corresponding test structure. For example, a low pattern density region of a circuit being tested may include a test structure including a defect-generating region having a zero pattern density (FIG. 3C). Alternatively, higher pattern density regions of a circuit being tested may include a test structure including defect-generating regions having non-zero pattern density (e.g., FIG. 3D or FIG. 3E).

Referring to FIG. 3C, an embodiment of the test structure at a cross-section along line A-A' of FIG. 3A is shown. the exemplary test structure 300 may include the defect-dispersing region 324 and the defect-detecting region 323 (not shown in this cross-section) formed in a second metallization layer 320 (further including third dielectric layer 321 and fourth dielectric layer 322, equivalent to second metallization layer 220 of FIGS. 2A-2I). Second metallization layer 320 is above a first metallization layer 310 (further including first dielectric layer 311 and second dielectric layer 312, equivalent to a first metallization layer 210 of FIGS. 2A-2I). In FIG. 3C, first metallization layer 310 includes defect-generating region 325, which has a zero pattern density (i.e., there are no metal features present) directly under the defect-dispersing region 324. Because defect density may increase as pattern density decreases, the exemplary embodiment of FIG. 2C may be used to determine the maximum defect density of a given planarization process.

Referring to FIG. 3D, another embodiment of the test structure at a cross-section along line A-A' of FIG. 3A is shown. Here, the features are as described in conjunction with FIG. 3C, with the exception that first metallization layer 310 now includes defect generating region 325 with a uniform non-zero pattern density in the region under defect-dispersing region 234, as indicated by the metal features 340. The metal features 340 may be lines, vias, or any other feature known in the art and correspond to metal features 216a-216c of FIG. 2D. The pattern density as depicted in FIG. 3D is uniform, meaning the spacing between the metal features 240 are the same and the width of each metal feature 240 is the same. The pattern density may be minimum pitch or greater. Those skilled in the art will recognize that the numerical value of the minimum pitch will vary with technology node and device level. The width of the metal feature may be minimum CD (critical dimension) or larger. Those skilled in the art will recognize that the numerical value of the CD will vary with technology node and device level. By having a uniform pattern density underneath the defect-dispersing region, a test structure may be used to determine the expected defect concentration for that given pattern density. A field of test structures may then be employed, each with different but uniform pattern densities, to determine a correlation between pattern density and defect concentration.

Referring to FIG. 3E, another embodiment of the test structure at a cross-section along line A-A' of FIG. 3A is shown. Here, the features are as described in conjunction with FIGS. 3C and 3D, with the exception that the first metallization layer 310 now includes defect generating region 325 with non-uniform non-zero pattern density in the region under defect-dispersing region 324 as indicated by the metal features 340. As depicted in FIG. 3E, the spacing between each metal feature 340 is different while the width of each metal feature 340 is the same. Alternatively, pattern density may vary due to varying width of the metal features 340 while the spacing between metal features 340 stayed the same or varied (not shown). In addition, when viewing top down, there may be rows of metal features which may have the same or different metal widths and/or lengths, as well as different spacing between rows (not shown). A non-uniform pattern density underneath the defect-dispersing region may allow a single test structure to monitor a planarization process at different pattern densities by determining where on the defect-detecting region defects are found and correlating that location to the pattern density of the surrounding defect-dispersing region.

Figure 4:
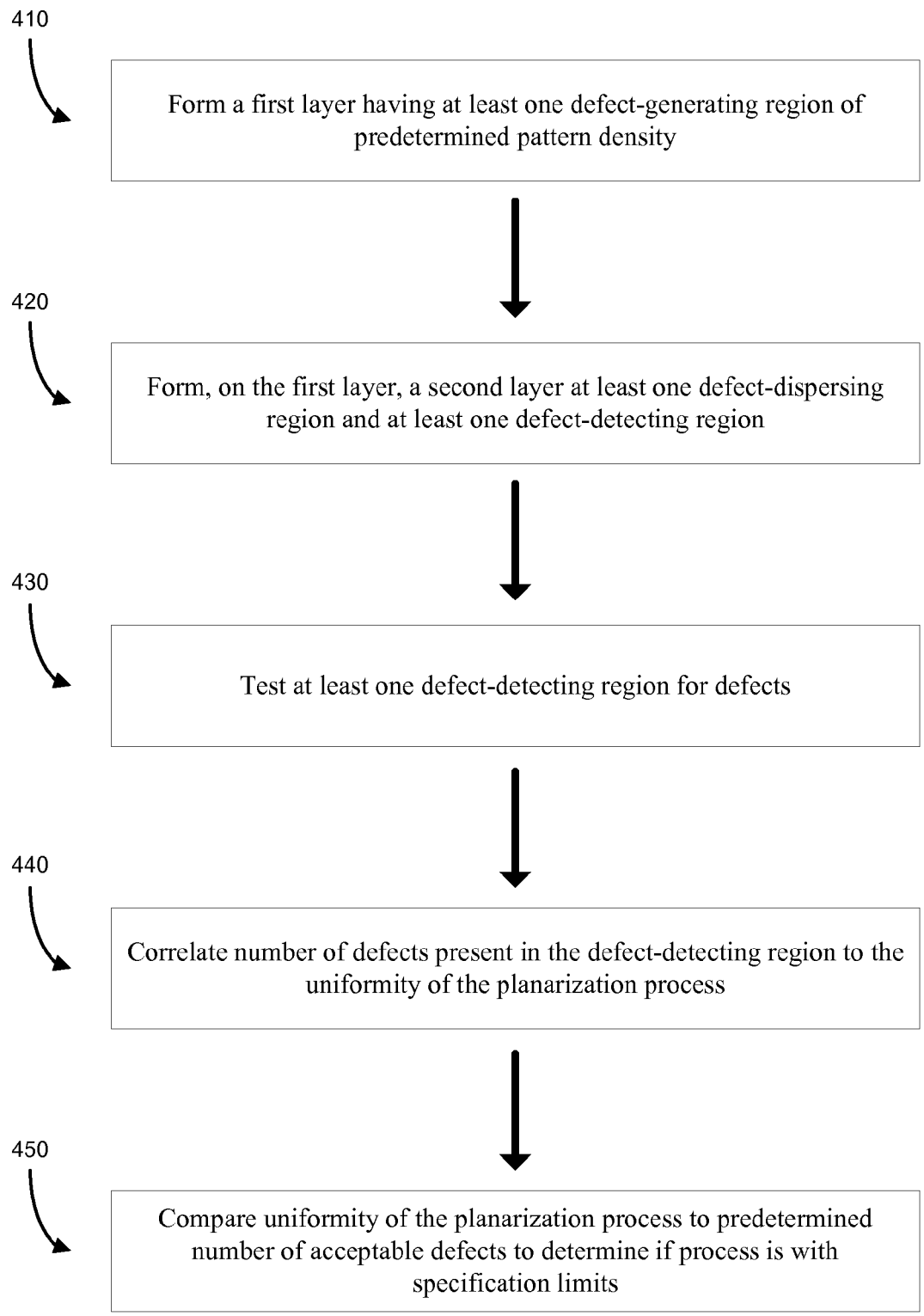
FIG. 4 is a flowchart depicting a method of monitoring a back-end manufacturing process, according to one embodiment of the invention.

By using the test structures of FIGS. 2A-3E, a planarization process, such as the process depicted in FIG. 1D may be monitored according to the operational flowchart of FIG. 4. The monitoring process begins at step 410 by forming a first metallization layer having a defect-generating region with a predetermined pattern density, for example, as depicted in FIGS. 2A-2D. In step 420, a second metallization layer containing a at least one defect-detecting region and at least one defect-dispersing region is formed on top of the first metallization layer, as depicted, for example, in FIGS. 2E-2I.

Figure 5A:
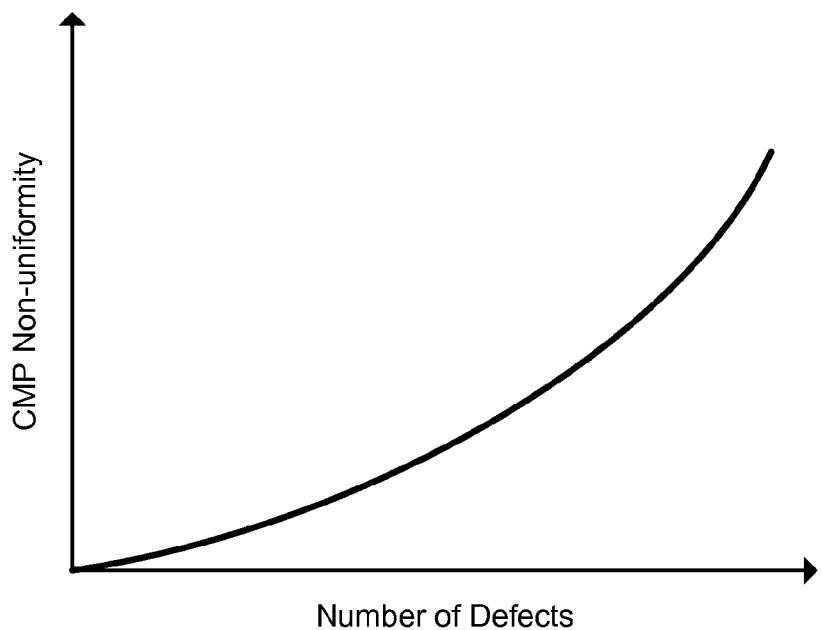
FIGS. 5A-5B are graphs depicting potential relationships between a CMP process and resulting defect levels.

In step 430, the defect-detecting region is then tested or inspected for defects, for example optically or by measuring the electrical resistance between different points of the defect-detecting region. In step 440, the number of defects identified in step 430 is correlated to the uniformity of the planarization process for the predetermined pattern density. The graph of FIG. 5A depicts a possible relationship between the number of defects detected and the non-uniformity of the CMP process, where an increase in defect concentration correlates to an exponentially greater non-uniformity.

Figure 5B:
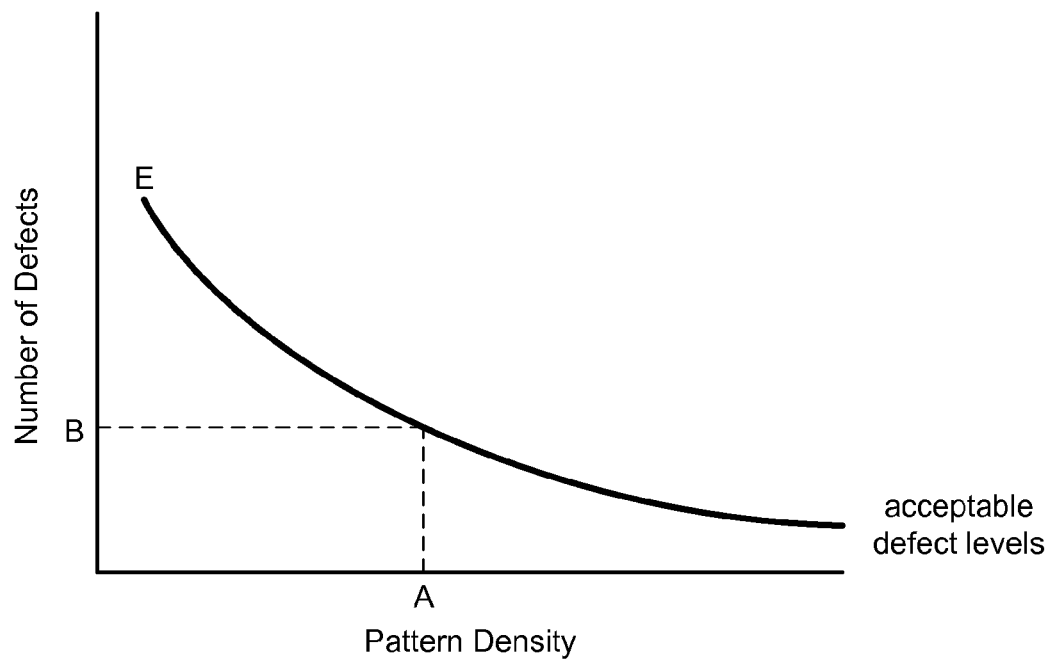

In step 450, the number of defects is compared to a predetermined number of acceptable defects to determine if the planarization process is within specification limits. The graph of FIG. 5B depicts the number of defects for a given pattern density of an acceptable and an unacceptable CMP process. By comparing the number of defects identified in step 430 to the acceptable defect levels of FIG. 5B, it can be determined if the CMP process is within specification limits (i.e., defect levels of the test structure do not exceed a predetermined maximum value).

For example, it may be determined that, for a given CMP process, a test structure may produce an acceptable level of defects for each pattern density, graphically depicted as curve E of FIG. 5B. For example, a test structure with a pattern density A may produce a maximum number of defects B while remaining within specification limits. If the number of defects determined in step 430 for a test structure with a pattern density A is less than B, then the CMP process is within specification limits. If, however, the number of defects is greater than B, then the CMP process is outside the predetermined specification limits.

Referring to FIGS. 6-9, several other embodiments of the present invention including alternate configurations of the defect-dispersing region and/or defect-detecting region are depicted. In these alternate embodiments, the features are as described in conjunction with FIGS. 3A-3E, with the exception that the embodiments depicted in FIGS. 6-9 include multiple defect-dispersing regions and/or defect-detecting regions.

Figure 6:
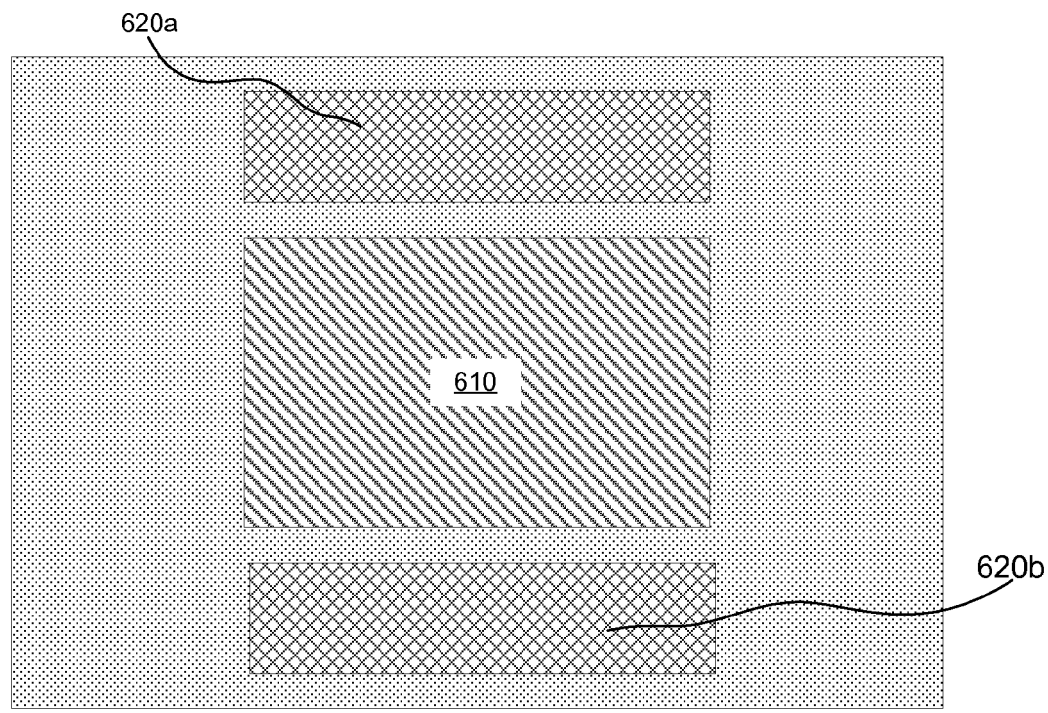
FIGS. 6-9 depict top-down views of structures for detecting defects according to alternate embodiments.

Referring to FIG. 6, in other embodiments, the defect-dispersing region may include several smaller, non-contiguous regions. Further, the defect-dispersing region or regions may not fully surround the defect-detecting region. For example, the exemplary embodiment of FIG. 3A-3E includes two defect-dispersing subregions 620a and 620b surrounding a single defect-detecting region 610. Each defect-dispersing region may have may be formed above the same defect-generating region, or separate defect-generating regions, which may or may not have similar pattern densities (not shown). Each defect-dispersing may be of the same approximate dimensions, as are defect-dispersing regions 620a and 620b of the depicted embodiments, or may be different dimensions with one defect-dispersing region being longer and/or wider than the other.

Figure 7:
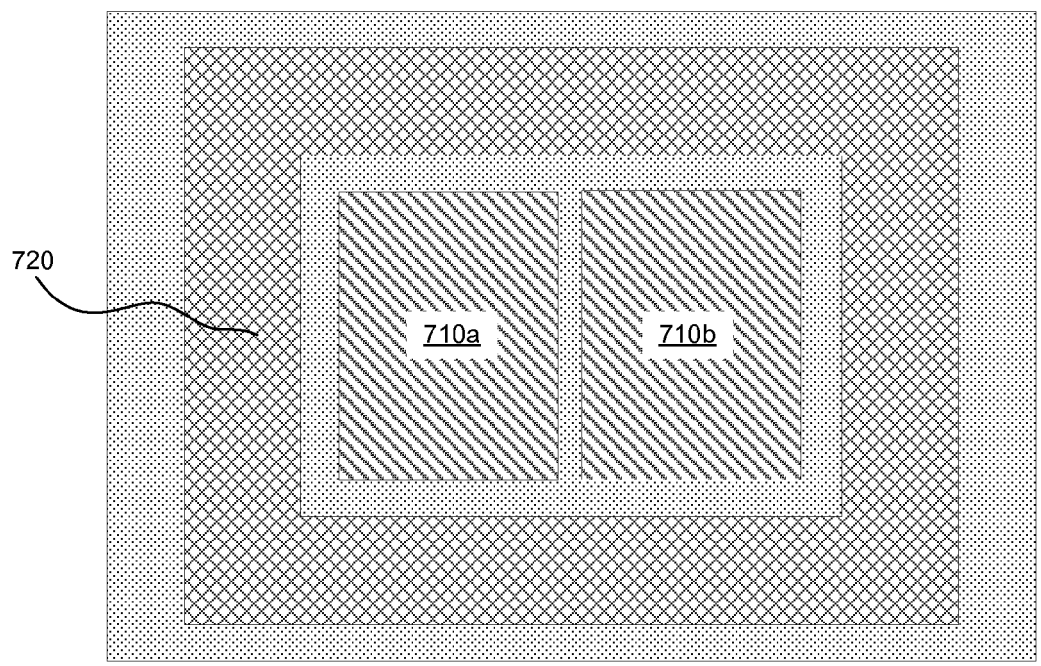

Referring to FIG. 7, the defect-detecting region may further include several discrete defect-detecting subregions 710a and 710b. By varying the pattern density underneath defect-dispersing region 720, defect-detecting-subregions 710a and 710b may independently test defect concentration resulting from different pattern densities. Further, defect-detecting-subregions 710a and 710b may include the same or different test patterns, in the same or different orientations.

Figure 8:
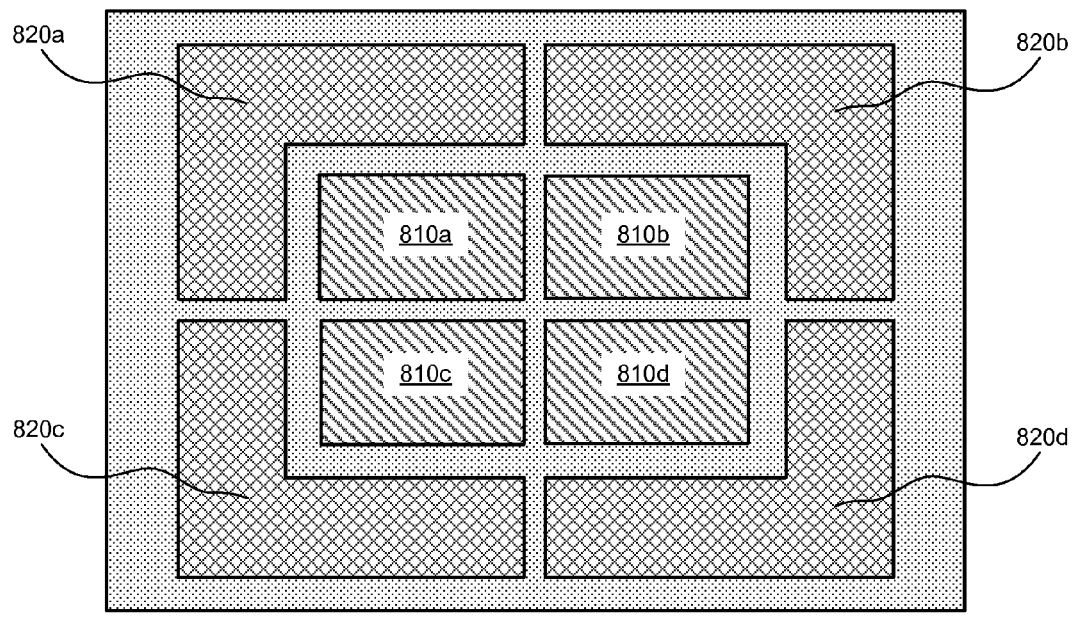
Figure 9:
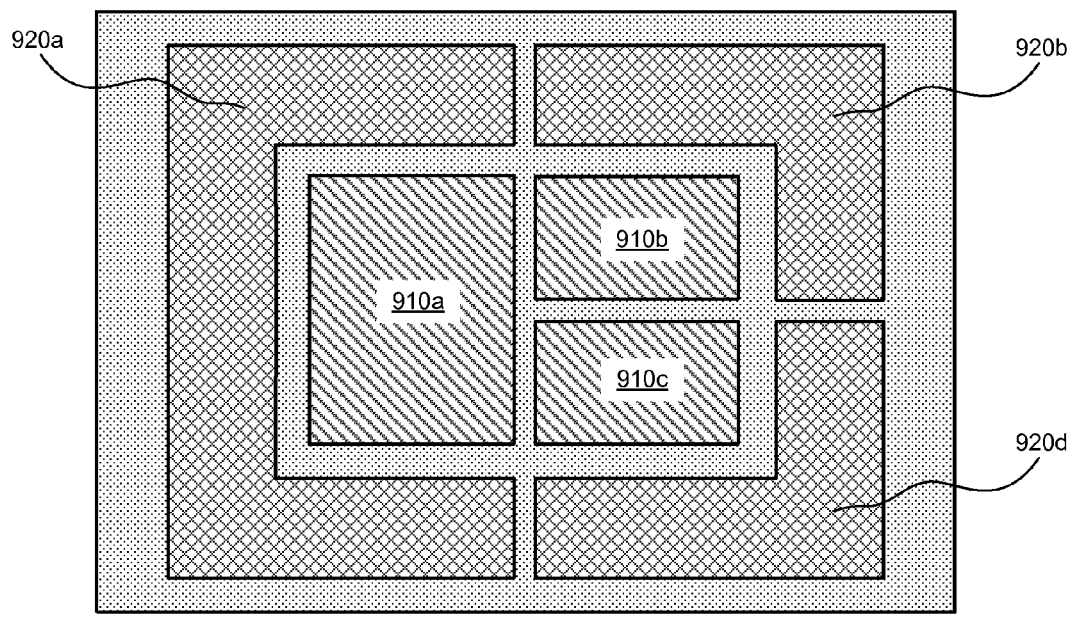

As depicted in FIGS. 8-9, some embodiments may include both multiple discrete defect-detecting regions (810a-810d, 910a-910c) and multiple discrete defect-dispersing regions (820a-820d, 910a-910c) to allow for greater flexibility in monitor defect frequency under varying conditions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

What is claimed is:

1. A method of monitoring defects comprising:
forming a first metallization layer having an defect-generating region with predetermined pattern density;
forming a second metallization layer on a surface of the first metallization layer, wherein the second metallization layer has a defect-detecting region comprising a test structure laterally offset from the defect-generating region, and a defect-dispersing region comprising a metal line formed above the defect-generating region of the first metallization layer; and
inspecting the defect-detecting region for defects.

2. The method of claim 1, wherein forming a first metallization layer having a defect-generating region with a predetermined pattern density comprises:
depositing an insulating layer on a microelectronic structure;
etching the insulating layer to form recess regions in a given area, wherein the given area comprises the defect-generating region;
filling the recess regions with metal to form metal features, wherein the top down area of the metal features divided by the total area of the defect-generating region is equal to the predetermined pattern density; and
planarizing the insulating material to remove excess metal from outside the recess regions.

3. The method of claim 1, wherein the pattern density of the defect-generating region is zero.

4. The method of claim 1, where the pattern density of the defect-generating region is uniform and non-zero.

5. The method of claim 1, wherein the pattern density of the defect-generating region is non-uniform.

6. The method of claim 1, wherein the test structure comprises a comb-serpentine test structure.

7. The method of claim 6, wherein inspecting the defect-generating region for defects comprises forming electrical contacts to the comb-serpentine test structure and measuring the electrical resistance.

8. The method of claim 1, wherein inspecting the defect-detecting region for defects comprises optically examining the defect-detecting region.

9. A method for monitoring a chemical-mechanical planarization process comprising:
forming a first metallization layer having a defect-generating region;
forming a second metallization layer on a surface of the first metallization layer, wherein the second metallization layer has a defect-dispersing region comprising a metal line above the defect-generating region and a defect-detecting region comprising a test structure laterally offset from the defect-generating region;
inspecting the defect-detecting region for defects;
correlating the number of defects with the uniformity of the chemical-mechanical planarization process; and determining if the chemical-mechanical planarization process is in specification by comparing the uniformity of the chemical-mechanical planarization process to a predetermined standard.

10. The method of claim 1, wherein the defect-generating region comprises a plurality of metal features.

11. The method of claim 9, wherein the defect-generating region comprises a plurality of metal features.

12. A structure for detecting defects in microelectronic devices comprising:
   a first metallization layer;
   a second metallization layer on a surface of the first metallization layer;
   a defect-generating region in the first metallization layer, wherein defect-generating region has a varying pattern density underneath the defect-generating region;
   a defect-dispersing region in the second metallization layer, wherein the defect dispersing region comprises a metal line above the defect-generating region; and
   a defect-detecting region in the second metallization layer, wherein the defect-detecting region comprises a test structure laterally offset from the defect-dispersing region.

13. The structure of claim 12, wherein the metal line is approximately 1 micron wide.

* * * * *